(12) United States Patent
Sinha

(10) Patent No.: US 8,530,000 B2
(45) Date of Patent: Sep. 10, 2013

(54) METHODS OF FORMING CHARGE-TRAPPING REGIONS

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1421 days.

(21) Appl. No.: 11/857,943

(22) Filed: Sep. 19, 2007

(65) Prior Publication Data

US 2009/0074950 A1    Mar. 19, 2009

(51) Int. Cl.
*B05D 5/12*    (2006.01)

(52) U.S. Cl.
USPC ............ 427/421.1; 427/427; 427/427.4; 427/427.5; 427/58; 516/1; 365/183; 977/700

(58) Field of Classification Search
USPC ............ 427/421.1, 427, 427.4, 427.5, 58; 516/1; 365/183; 977/700
See application file for complete search history.

(56) References Cited

U.S. PATENT DOCUMENTS

| | | | |
|---|---|---|---|
| 5,506,054 A | 4/1996 | Browning et al. | |
| 5,690,807 A | 11/1997 | Clark, Jr. et al. | |
| 6,025,034 A | 2/2000 | Strutt et al. | |
| 6,277,766 B1 | 8/2001 | Ayers | |
| 6,463,760 B1 | 10/2002 | Fink-Straube et al. | |
| 6,573,131 B2 | 6/2003 | Yan et al. | |
| 6,585,947 B1 | 7/2003 | Nayfeh et al. | |
| 6,586,785 B2 * | 7/2003 | Flagan et al. ............. | 257/261 |
| 6,994,837 B2 | 2/2006 | Boulos et al. | |
| 7,011,760 B2 | 3/2006 | Wang et al. | |
| 7,157,068 B2 | 1/2007 | Li et al. | |
| 7,465,953 B1 * | 12/2008 | Koh et al. ................. | 257/9 |
| 2002/0005876 A1 * | 1/2002 | Grimes et al. ............ | 347/53 |
| 2003/0108683 A1 | 6/2003 | Wu | |
| 2004/0004863 A1 * | 1/2004 | Wang ....................... | 365/199 |
| 2007/0042507 A1 | 2/2007 | Tsang et al. | |
| 2007/0228452 A1 * | 10/2007 | Asami ...................... | 257/315 |

FOREIGN PATENT DOCUMENTS

| | | |
|---|---|---|
| WO | WO2006/071419 A2 | 7/2006 |
| WO | WO2007/024323 A2 | 3/2007 |

OTHER PUBLICATIONS

Dai, S., "A New Method for In-situ Characterization of Important Actinides and Technetium Compounds via Fiberoptic Surface Enhanced Raman Spectroscopy (SERS)", Research Project 81927, Chemical Sciences Div., Oak Ridge Natl. Lab., Oak Ridge TN, Jun. 15, 2002, 2 pgs.

Adachi, M. et al., "Arrangement of Nanoparticles on Substrate by Cluster Ion Deposition Method", $2^{nd}$ Inter. Sym. Nanotechnology and Occupational Health, Minneapolis, MN, Oct. 3-6, 2005, 14 pgs.

Ostraat, Michele L., et al. "Ultraclean Two-Stage Aerosol Reactor for Production of Oxide-Passivated Silicon Nanoparticles for Novel Memory Devices" Journal of The Electrochemical Society, 148 G265-G270.

(Continued)

*Primary Examiner* — Timothy Meeks
*Assistant Examiner* — Nathan T Leong
(74) *Attorney, Agent, or Firm* — Wells St. John P.S.

(57) ABSTRACT

Some embodiments include methods of forming charge-trapping zones. The methods may include forming nanoparticles, transferring the nanoparticles to a liquid to form a dispersion, forming an aerosol from the dispersion, and then directing the aerosol onto a substrate to form charge-trapping centers comprising the nanoparticles. The charge-trapping zones may be incorporated into flash memory cells.

13 Claims, 9 Drawing Sheets

(56) References Cited

OTHER PUBLICATIONS

Homma, Tetsuya, et al. "Optical Properties of Fluorinated Silicon Oxide Films by Liquid Phase Deposition for Optical Waveguides" IEEE Transactions on Instrumentation and Measurement, Vo. 47, No. 3 Jun. 1998 pp. 698-702.

Ye, Giong, et al. "Ferroelectric Metal-Organic Framework with a High Dielectric Constant" JACS Communications, Published on Web Apr. 29, 2006

Shimono, Norifumi et al. "Polymer Adsorption Effects on Stabilities and Chemical Mechanical Polishing Properties of Ceria Particles" Japanese Journal of Applied Physics, vol. 45, No. 5! 2006, pp. 4196-4200.

Wikipedia "Sol gel" reprinted Aug. 7, 2007; http://en.wikipedia.org/wiki/Sol_gel.

Namamcha Abderrafik, et al. Synthesis of Palladium Nanparticles by Sonochernical Reduction of Palladium(II) Nitrate in Aqueous Solution.

Aegerter, M.A, et al. "Versatile wet deposition techniques for functional oxide coatings" Science Directory Optical Materials 26 (2004) 155-162.

* cited by examiner

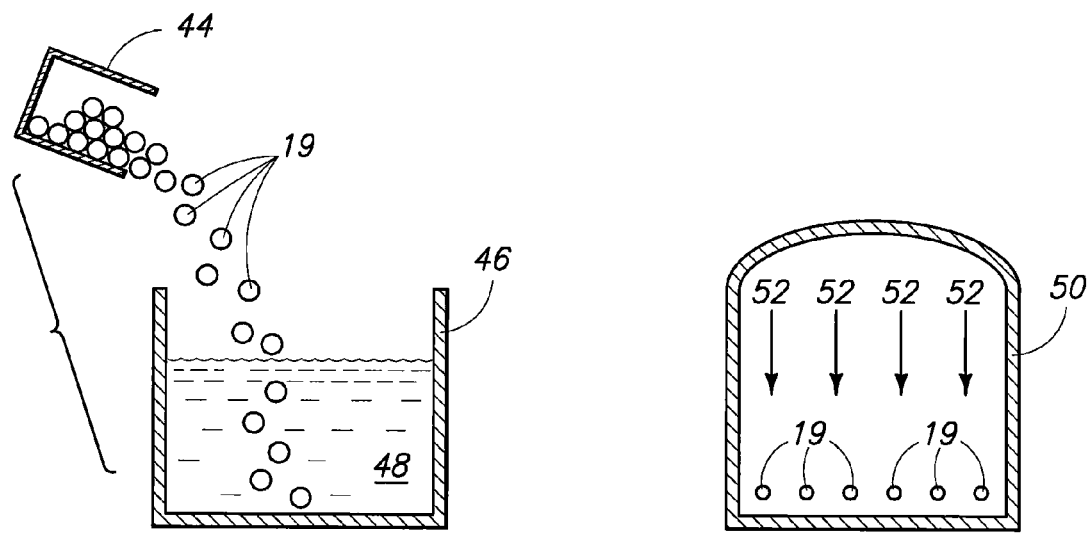
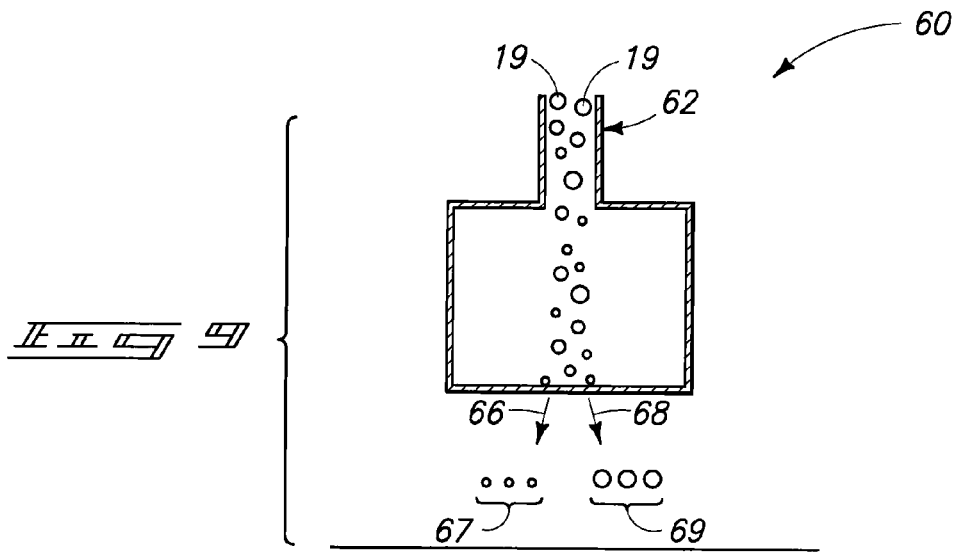

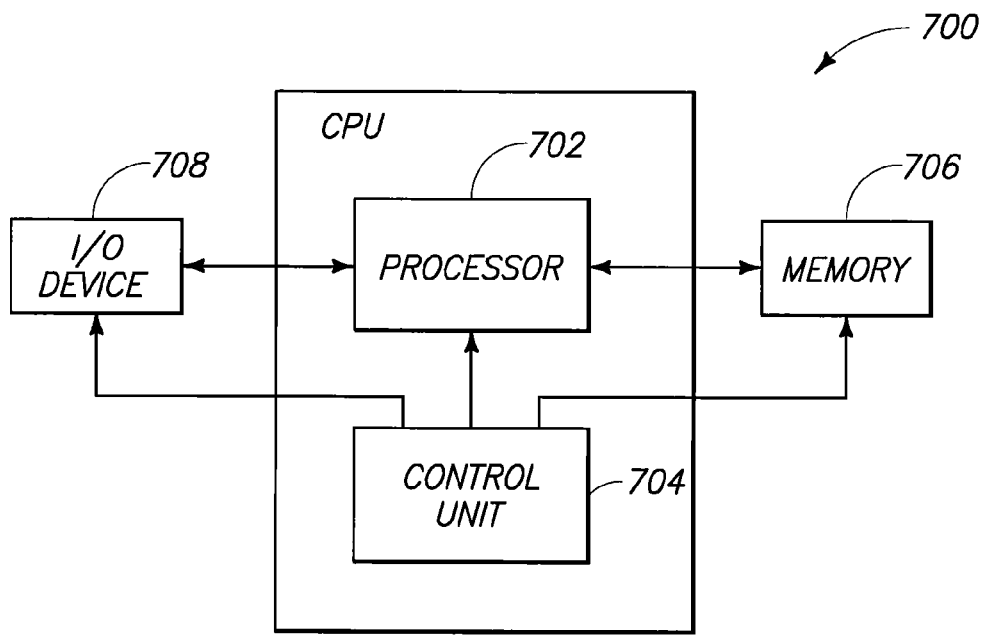
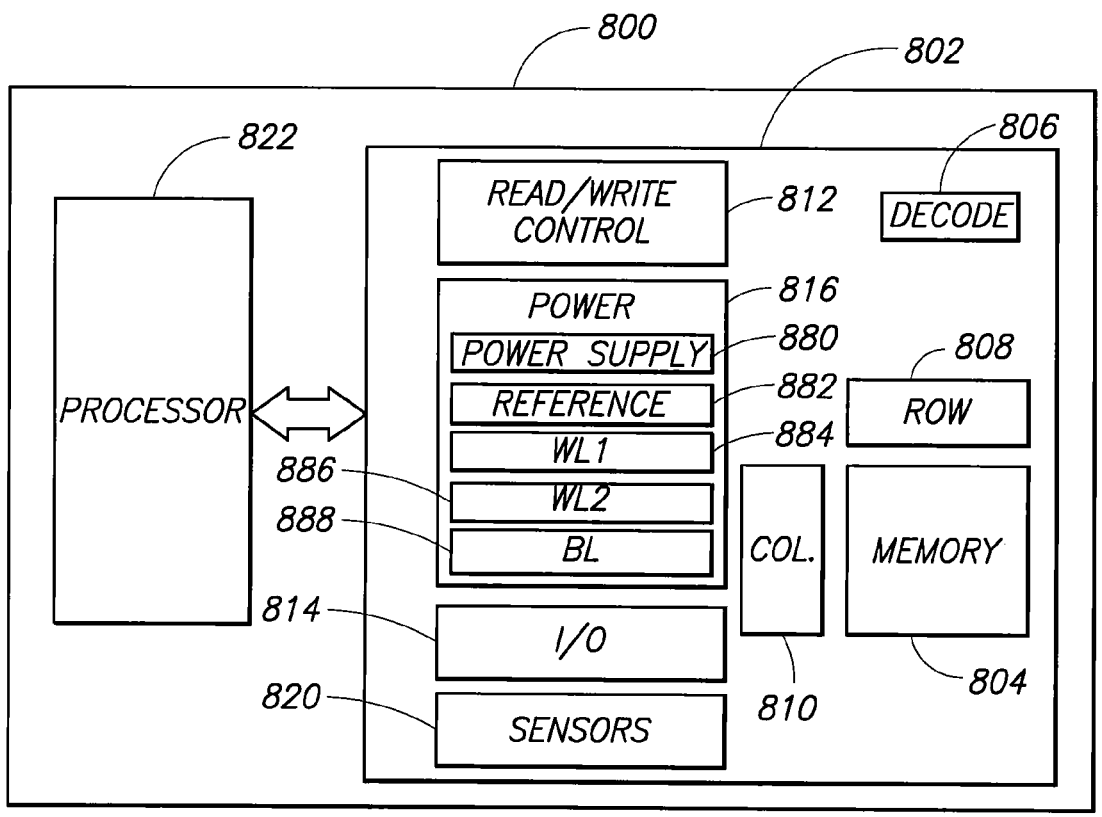

METHODS OF FORMING CHARGE-TRAPPING REGIONS

TECHNICAL FIELD

Methods of forming charge-trapping regions.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Flash memory is also popular in wireless electronic devices because it enables the manufacturer to support new communication protocols as they become standardized, and to provide the ability to remotely upgrade the device for enhanced features.

A typical flash memory comprises a memory array that includes a large number of non-volatile memory cells arranged in row and column fashion. The cells are usually grouped into blocks. Each of the cells within a block may be electrically programmed by charging a charge storage region. The charge may be removed from the charge storage region by a block erase operation. Data is stored in a cell as charge in the charge storage region.

NAND is a basic architecture of flash memory. A NAND cell unit comprises at least one select gate coupled in series to a serial combination of memory cells (with the serial combination being commonly referred to as a NAND string). The gates of the NAND string have traditionally been single level cells (SLCs), but manufacturers are transitioning to utilization of multilevel cells (MLCs) for gates of NAND strings. An SLC stores only one data bit, whereas an MLC stores multiple data bits. Accordingly, memory can be at least doubled by transitioning from SLCs to MLCs.

Charge has traditionally been stored within flash memory in a floating gate. The floating gate may comprise, for example, conductively-doped silicon. Recently, interest has developed in utilizing charge-trapping materials to store charge. The charge-trapping materials may be layers (such as layers of silicon nitride) that have charge-trapping centers therein, or may be discrete islands that individually function as charge-trapping centers.

Of particular interest is the utilization of nanoparticles as charge-trapping centers; with nanoparticles being understood to be structures less than or equal to about 1000 nanometers along a maximal cross-section, and frequently less than 10 nanometers, or even less than 3 nanometers along a cross-section. In some applications, the nanoparticles may have maximal cross-sectional dimensions of from about 1 nanometer to about 100 nanometers. The nanoparticles may be configured to trap less than or equal to about 20 charges, and may, for example, be configured to trap from about one charge to about 20 charges. The nanoparticles may be substantially spherical, and the substantially spherical nanoparticles may be referred to as nanodots.

The nanoparticles may have any of numerous compositions, and may, for example, comprise, consist essentially of, or consist of one or more of Au, Ag, Co, Ge, Ir, Ni, Pd, Pt, Re, Ru, Si, Ta, Te, Ti and W.

The amount of charge stored on individual nanoparticles may depend on the size and composition of the nanoparticles.

Problems with the utilization of nanoparticles occur in obtaining uniform distribution of nanoparticles (i.e., a uniform population density of the nanoparticles as expressed in nanoparticles per unit area), and uniform size of the nanoparticles. If there is too much variation in distribution and/or size of the nanoparticles, then there may be excessive variation in cell-to-cell performance parameters. Variation in cell-to-cell performance may be particularly problematic for MLC-type devices.

It is desired to develop fabrication processes which alleviate or overcome one or more of the above-discussed difficulties.

BRIEF DESCRIPTION OF THE DRAWINGS

FIG. 5 is a diagrammatic, cross-sectional view of a process for coating nanoparticles in accordance with an embodiment.

FIG. 6 is a diagrammatic, cross-sectional view of a process for coating nanoparticles in accordance with an embodiment.

FIGS. 7 and 8 are diagrammatic, cross-sectional views of coated nanoparticles in accordance with a couple of embodiments.

FIG. 9 is a diagrammatic, cross-sectional view of an apparatus for sorting nanoparticles by size.

FIG. 17 is a high level block diagram of an electronic system embodiment.

FIG. 18 is a simplified block diagram of a memory device embodiment.

DETAILED DESCRIPTION OF THE ILLUSTRATED EMBODIMENTS

In some embodiments, the invention includes processes in which nanoparticles are formed, cleaned and sorted by size to form a powder of uniformly-sized nanoparticles. Such powder may then be dispersed within a liquid. Subsequently, an aerosol may be formed from the liquid having the nanoparticles dispersed therein, and such aerosol may be directed onto a substrate. The nanoparticles may form a distribution of charge-trapping centers across the substrate, and such distribution may be incorporated into flash memory.

Example embodiments are described below with reference to FIGS. 1-18.

Figure 1:
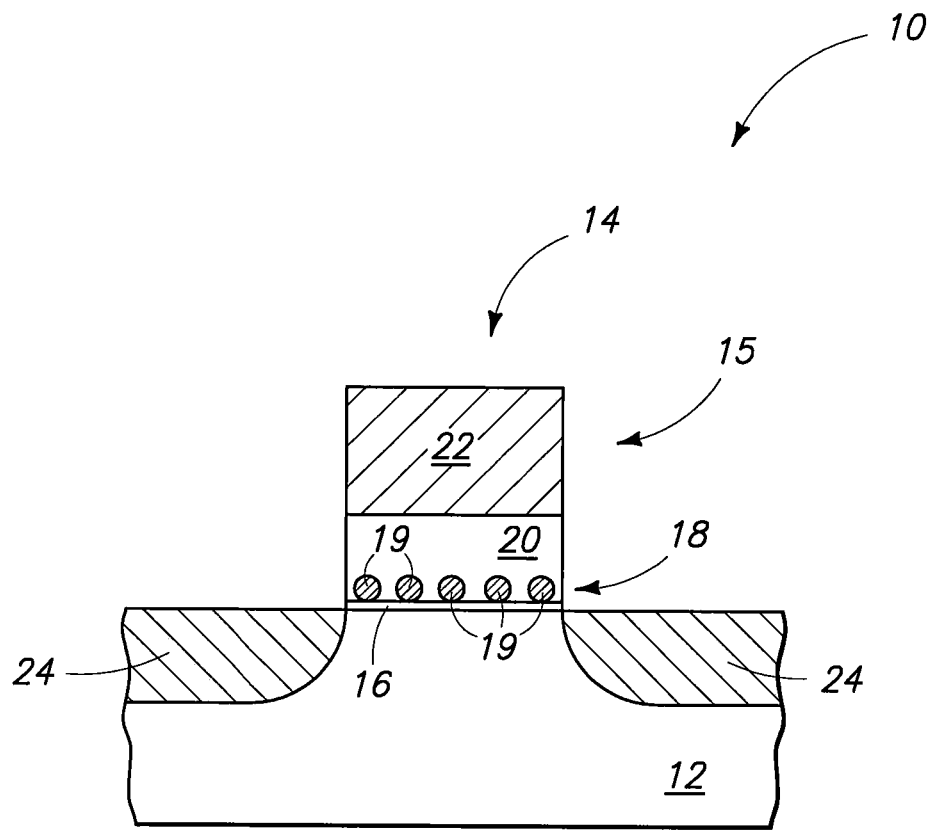
FIG. 1 is a diagrammatic, cross-sectional view of a flash memory cell embodiment.

Referring to FIG. 1, an example embodiment of a flash memory cell 15 is shown as part of a semiconductor construction 10.

The semiconductor construction comprises a base 12. Base 12 may, for example, comprise, consist essentially of, or consist of monocrystalline silicon lightly-doped with background p-type dopant, and may be referred to as a semiconductor substrate, or as a portion of a semiconductor substrate.

The terms "semiconductive substrate" and "semiconductor substrate" are defined to mean any construction comprising semiconductive material (for instance silicon and/or germanium), including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A gate stack 14 is supported by base 12. The gate stack includes a tunnel dielectric 16, a charge-trapping zone 18 over the tunnel dielectric, a blocking dielectric material 20 over the charge-trapping zone, and a control gate 22 over the blocking dielectric material.

The shown embodiment comprises a single charge-trapping zone 18 within the memory cell. Other embodiments may have additional charge-trapping zones stacked over the illustrated charge trapping zone of the memory cell.

The charge-trapping zone 18 comprises a plurality of discrete islands of charge-trapping material (the islands are labeled 19). The islands are illustrated to comprise electrically conductive material (such as metal), but in other embodiments at least some of the islands may comprise charge-trapping dielectric material. The islands may correspond to nanoparticles (such as, for example, nanodots) in some embodiments. The charge-trapping material may comprise metal, conductively-doped semiconductor material (for instance, conductively-doped silicon or germanium) and/or silicon nitride.

In some embodiments, the charge-trapping islands may comprise, consist essentially of, or consist of one or more of Au, Ag, Co, Ge, Ir, Ni, Pd, Pt, Re, Ru, Si, Ta, Te, Ti and W.

The blocking dielectric material 20 may comprise any suitable composition or combination of compositions. In some embodiments, the blocking dielectric material 20 will comprise high-k dielectric material. At least a portion of the high-k dielectric material may be charge-trapping material, such as silicon nitride; and the high-k dielectric material may thus supplement the charge-trapping characteristics of the charge-trapping zones. In other embodiments, the blocking dielectric material 20 will consist of dielectric material that is not charge trapping; with such dielectric material being silicon dioxide and/or high-k material. In some embodiments, the blocking dielectric material 20 will comprise one or more oxides selected from the group consisting of lanthanide oxides, HfSiON, $HfO_2$, $Al_2O_3$, $HfAl_xO_y$, $HfSi_pO_q$, and $ZrO_2$; where x, y, p and q are greater than zero.

The tunnel dielectric material 16 may comprise any suitable composition or combination of compositions, and may, for example, comprise, consist essentially of, or consist of silicon dioxide and/or various high-k materials.

The control gate 22 may comprise any suitable composition or combination of compositions. For instance, the control gate may comprise one or more of various metals (for instance, tungsten, titanium, etc.), metal-containing compositions (for instance, metal silicides, metal nitride, etc.) and conductively-doped semiconductor materials (for instance, conductively-doped silicon, etc.).

A pair of source/drain regions 24 are formed on opposing sides of gate stack 14. In the shown embodiment, the source/drain regions are conductively-doped regions of the semiconductor material of base 12. Regions 24 may be either n-type or p-type majority doped.

Some embodiments include methods of forming a flash memory cell, such as, for example, the cell of FIG. 1. Example methods are particularly directed toward procedures which may be utilized for forming nanoparticles 19 of uniform size, and composition; and toward procedures which may be utilized for forming uniform population densities of nanoparticles across a plurality of memory cells (with population density being the number of nanoparticles per unit area).

Figure 2:
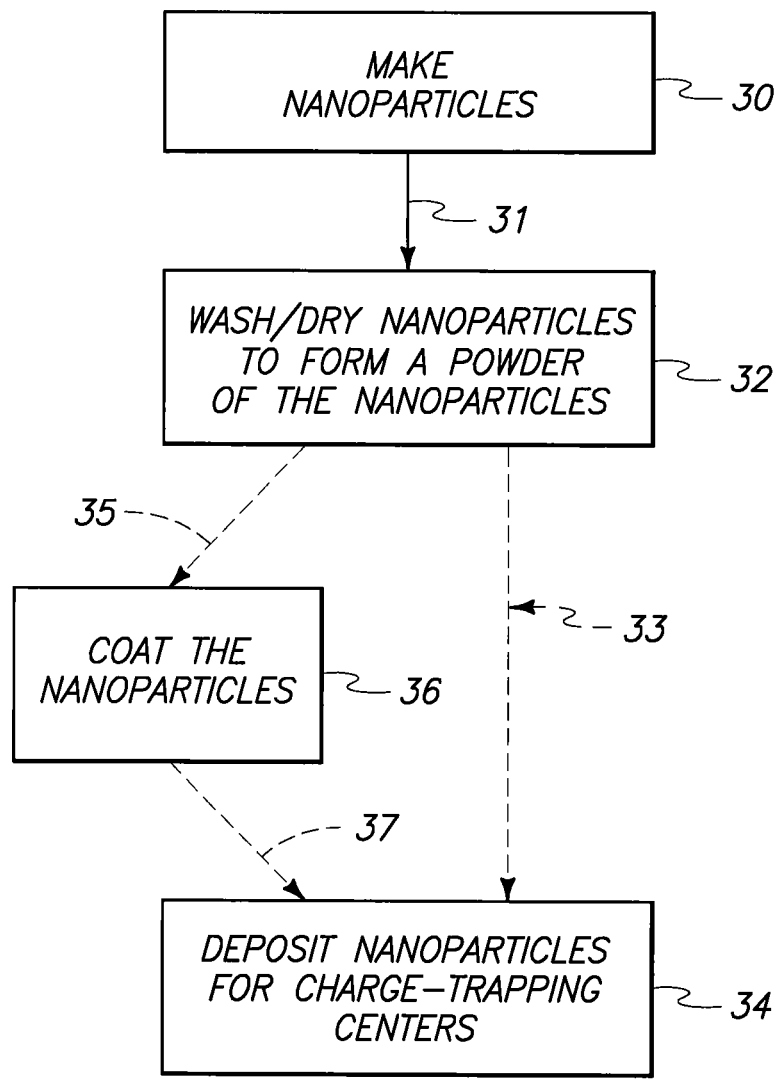
FIG. 2 is a flow-chart diagram of processes in accordance with some embodiments.

FIG. 2 shows a flow chart diagram of example processing that may be used in some embodiments. An initial step 30 comprises making of the nanoparticles.

The next step (32) is to wash/dry the nanoparticles and form a powder of the nanoparticles. An arrow 31 designates process flow from step 30 to step 32.

A subsequent step 34 is to deposit the nanoparticles onto a substrate to form charge-trapping centers. Such charge-trapping centers may then be incorporated into a flash memory cell in further processing (not shown in FIG. 2).

The processing from the powder formation of step 32 to the deposition of nanoparticles of step 34 is linked by a dashed-line arrow 33. The dashing of the line is used to indicate that such is one of a plurality of alternate process flow paths. Another path is designated by a dashed-line arrow 35 as proceeding to a step 36 of coating the nanoparticles, and then by a dashed-line arrow 37 indicating that the coated nanoparticles may subsequently proceed to the step 34 of deposition of the nanoparticles. The coating of the nanoparticles may comprise forming a dielectric shell around the nanoparticles (as discussed below with reference to FIG. 7), or forming a conductive shell around the nanoparticles (as discussed below with reference to FIG. 8).

Additional processing which may occur during a process flow of FIG. 2 is the sorting of the nanoparticles by size. Such sorting may occur after making the nanoparticles and before washing and drying them (in other words, between steps 30 and 32); after washing and drying the nanoparticles and before depositing them (in other words, between steps 32 and 34); after washing and drying the nanoparticles and before coating them (in other words, between steps 32 and 36); after coating the nanoparticles and before depositing them (in other words between steps 36 and 34); or during the deposition of the nanoparticles (in other words, during step 34). Example processes for sorting the nanoparticles are discussed below with reference to FIGS. 9 and 10.

The forming of the nanoparticles at step 30 of FIG. 2 may comprise any suitable methodology, including, for example, sonochemistry as described in an article by A. Nemamcha, et. al. (A. Nemamcha, et. al., *Synthesis of Palladium Nanoparticles by Sonochemical Reduction of Palladium (II) Nitrate in Aqueous Solution*, J. Phys. Chem. B. 2006, 110, 383-387), and electrochemistry as described in U.S. Pat. No. 6,585,947 to Nayfeh et. al. The nanoparticles formed by sonochemistry or electrochemistry will be formed in a first medium (specifically, the liquid carrier, electrolyte and/or electrodes utilized during the sonochemistry or electrochemistry), and may be considered to be associated with the first medium. Another method is to form the nanoparticles across a supporting surface utilizing conventional methods. The conventional methods may include, for example, deposition of a thin film (specifically, a film of thickness of from about 1 nanometer to about 1.2 nanometers) followed by e-beam evaporation; co-sputtering metal with embedding insulator; pulsed nucleation; and/or templated self-assembly. Such conventional methodology may form constructions analogous to the construction 40 of FIG. 3 comprising nanoparticles 19 supported on a substrate 42. The nanoparticles 19 are supported by a first medium corresponding to substrate 42, and may be considered to be associated with such first medium.

Figure 3:
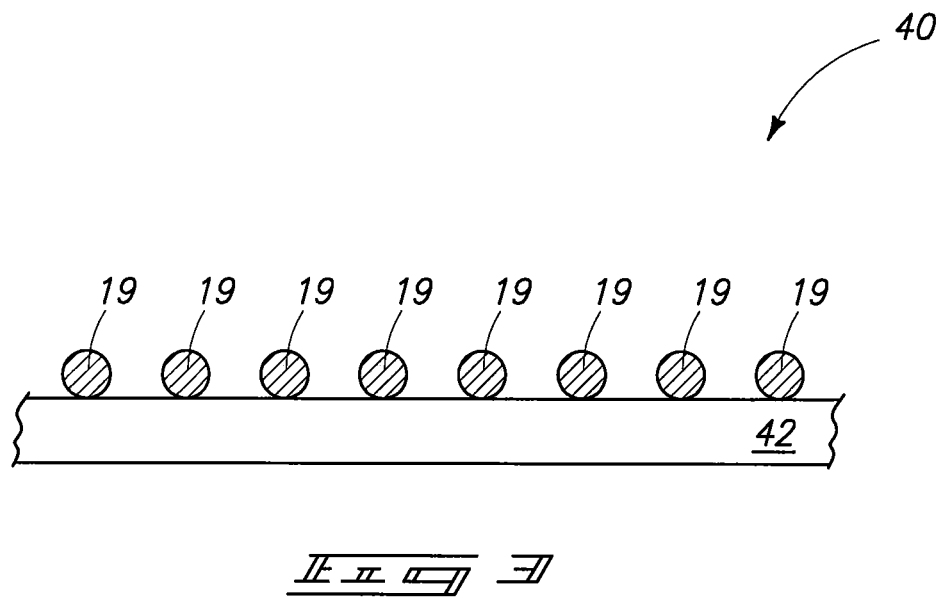
FIG. 3 is a diagrammatic, cross-sectional view of a structure which may be utilized during the harvesting of nanoparticles in accordance with an embodiment.

Regardless of which method is utilized to form the nanoparticles, the nanoparticles are subsequently cleaned by washing them with one or more appropriate solvents, and then drying them. The washing may including filtering the nanoparticles to separate them from liquid solutions and/or cleaning materials. The cleaning of the nanoparticles may be considered to separate the nanoparticles from the first medium that had been initially associated with the nanoparticles, regardless of whether such first medium is a liquid of a sonochemical method; an electrolyte or electrode of an electrochemical process; or a substrate of the construction of FIG. 3. If the nanoparticles are formed across a substrate as shown in FIG. 3, the nanoparticles may be first stripped from over the substrate by, for example, dissolving the substrate and/or by mechanical agitation of the substrate and/or by mechanical brushing of the nanoparticles.

The washing of the nanoparticles may comprise utilization of one or more volatile solvents, such as, for example, one or more of isopropyl alcohol, water, methanol and ethanol. The drying may be conducted at room temperature, or at a temperature higher than room temperature, and may be conducted during agitation of the nanoparticles to enable complete removal of the solvent.

Figure 4:
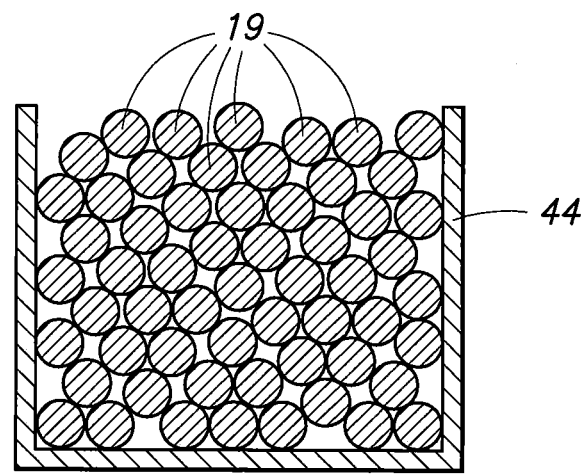
FIG. 4 is a diagrammatic, cross-sectional view of a container containing nanoparticles.

After the nanoparticles are washed and dried, they form a powder which may be retained within a vessel, as illustrated in FIG. 4. Specifically, FIG. 4 shows a vessel 44 retaining a powder comprising a plurality of nanoparticles 19 (only some of which are labeled).

In some embodiments, the nanoparticles may be subsequently coated to form a shell or coating encapsulating the nanoparticles. FIGS. 5 and 6 illustrate example methods that may be utilized for coating the nanoparticles.

Referring to FIG. 5, a vessel 46 is shown retaining a fluid 48. The nanoparticles 19 (only some of which are labeled) are shown being poured from the container 44 and into the fluid 48. The fluid may be of appropriate viscosity to coat the nanoparticles, and may be of appropriate composition that it may be cured to form a substantially solid coating around the nanoparticles. For instance, the fluid may comprise a sol-gel suspension, and the curing of the fluid may form an oxide (for instance silicon dioxide) encapsulating the nanoparticles. After the nanoparticles are poured into the fluid, they may be removed from vessel 46, strained to remove excess fluid, and then subjected to appropriate conditions to cure the material remaining around the nanoparticles (such material may be referred to as a coating precursor) to thereby form encapsulating shells (or coatings) around the individual nanoparticles.

FIG. 6 illustrates an alternative method of forming encapsulating shells around the nanoparticles. Specifically, FIG. 6 illustrates a chamber 50 suitable for physical vapor deposition (PVD), atomic layer deposition (ALD) and/or chemical vapor deposition (CVD). Nanoparticles 19 are placed within the chamber, and then exposed to material 52 which deposits an encapsulating shell (not shown in FIG. 6) around the nanoparticles. The deposition may comprise PVD, ALD or CVD.

Yet another method of forming a coating, when the coating is electrically conductive, is to plate the coating onto the nanoparticles. The plate may comprise electrolytic plating or electroless plating methodology.

FIGS. 7 and 8 illustrate encapsulated nanoparticles. FIG. 7 shows a nanoparticle 19 encapsulated with dielectric material 54, and FIG. 8 shows a nanoparticle 19 encapsulated with conductive material 56.

The dielectric material of FIG. 7 may comprise silicon dioxide and/or high-k material. In some embodiments, the dielectric material will be non-charge-trapping; and in other embodiments the dielectric material will be charge-trapping (for instance, the dielectric material may consist of silicon nitride). The dielectric material may be formed to any desired thickness, and may, for example, be formed to a thickness of from about 10 angstroms to about 100 angstroms. The dielectric material may have an electrically neutral outer surface, or may have a charged outer surface. For instance, the dielectric material outer surface may comprise carboxyl groups to provide a negative charge along the outer surface, or may comprise amino groups to provide a positive charge along the outer surface.

The electrically conductive material 56 of FIG. 8 may comprise elemental metal, and/or may comprise one or more metal-containing compounds (for instance, metal nitride, metal silicide, etc.), and/or may comprise conductively-doped semiconductor material. The electrically conductive material 56 may be formed to any desired thickness, and may, for example, be formed to a thickness of from about 10 angstroms to about 100 angstroms.

As discussed above with reference to FIG. 2, the nanoparticles may be size sorted at any of numerous processing stages. An example apparatus that may be utilized for size sorting is diagrammatically illustrated in FIG. 9 as an apparatus 60. Such apparatus comprises an inlet chute 62 which leads to a sorting mechanism 64, and further comprises outlet streams 66 and 68 exiting the sorting mechanism. The sorting mechanism may comprise, for example, a plurality of screens, an electrostatic-based differential mobility analyzer, a time of flight analyzer, and/or a magnetic deflection analyzer. The outlet streams 66 and 68 correspond to two different populations of nanoparticles sorted by size (with one of the populations shown as a population 67 of smaller nanoparticles, and the other shown as a population 69 of larger nanoparticles). Within each population, the nanoparticles may be the same size to within 10 percent (by volume), and accordingly may be within the same size to within from about 0.1 nanometers to about one nanometer. In some embodiments, the sorted nanoparticles may be nanodots having diameters of from about 2 nanometers to about 5 nanometers. Although only two populations are shown, in other embodiments more than two populations may be separated from one another by the sorting apparatus.

The powdered nanoparticles of FIG. 4, coated nanoparticles of FIGS. 7 and 8, and/or sorted nanoparticles of FIG. 9 may be distributed across a substrate utilizing any suitable method. An example method that may be particularly suitable for forming a uniform population density of the nanoparticles across a substrate is to utilize an aerosol-generating apparatus. Specifically, the nanoparticles are initially dispersed within a carrier fluid to form a dispersion, and subsequently such dispersion is passed through an aerosol-generating apparatus to form an aerosol which is directed toward a substrate surface. The nanoparticles within the aerosol are uniformly distributed across the substrate surface as they are carried by the aerosol to the substrate surface. The carrier fluid may comprise one or more volatile solvents (for instance, isopropyl alcohol, water, ethanol, methanol, etc.) so that the carrier fluid may be evaporated after the nanoparticles have been distributed across the surface.

Figure 10:
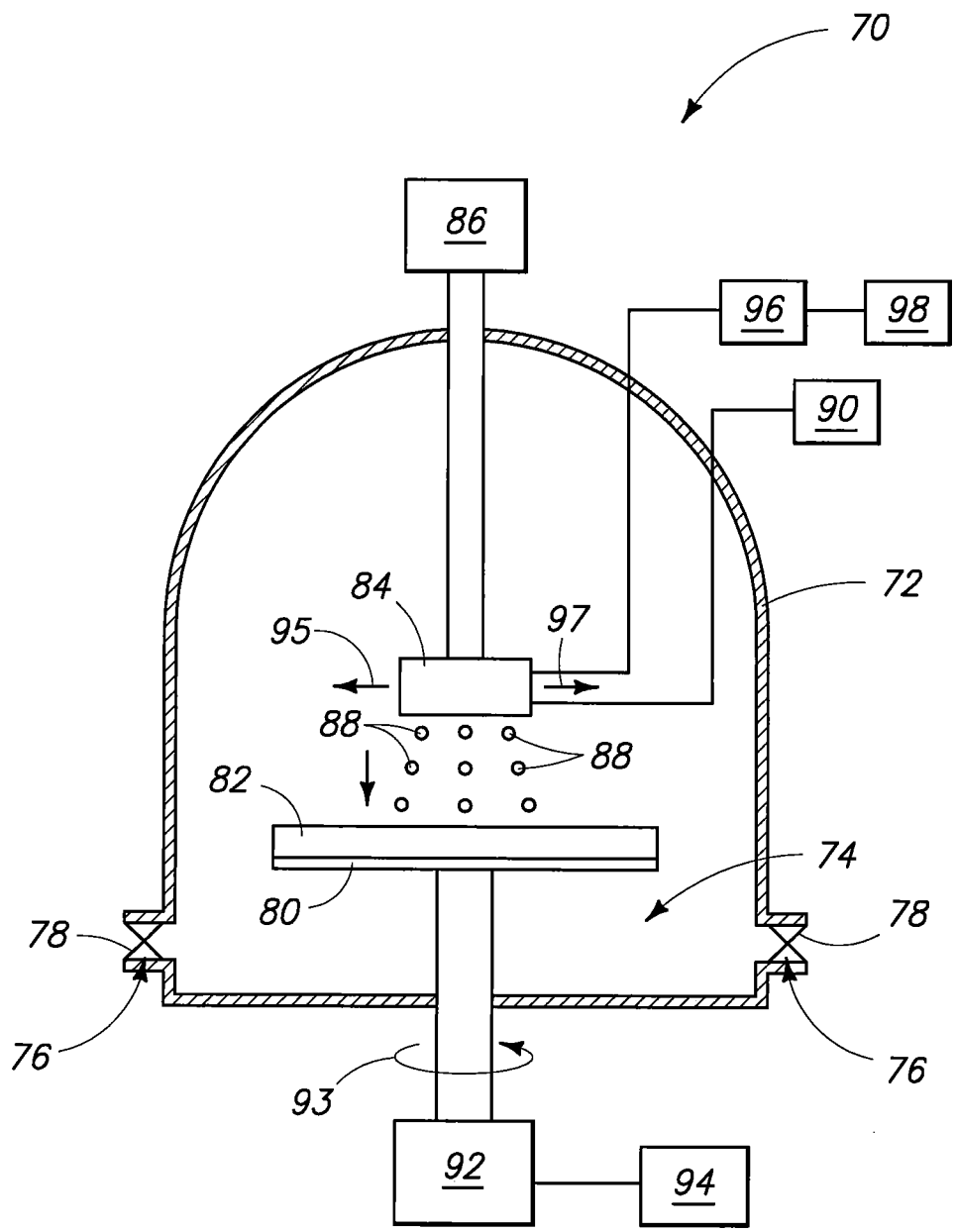
FIG. 10 is a diagrammatic, cross-sectional view of an apparatus which may be utilized for distributing nanoparticles across a substrate.

An example aerosol-generating apparatus 70 is diagrammatically illustrated in FIG. 10. The apparatus 70 includes a sidewall 72 that extends around a reaction chamber 74. Ports 76 extend through the sidewall to the chamber, and valves 78 regulate flow of materials through the ports. In operation, the valves may be utilized to control flow of gas into and out of the chamber so that desired pressure may be provided within the chamber. One or more of the ports may be in fluid communication with a pump (not shown), which may be utilized during control of the pressure within the chamber.

A substrate holder 80 is within the chamber, and such retains a substrate 82. The substrate holder may be configured to retain specific types of substrates. In some embodiments, the substrate 82 may correspond to a semiconductor substrate, and the substrate holder may be configured to retain the semiconductor substrate (for instance, the substrate holder may have a recess with a size and shape complementary to the semiconductor substrate).

An aerosol-forming nozzle 84 is within the chamber, and in fluid connection with a reservoir 86. In operation, liquid (specifically, the dispersion of nanoparticles in carrier liquid) is passed from reservoir 86 and through nozzle 84, whereupon it is atomized. The atomized liquid is then dispersed into the chamber as liquid aerosol particles (diagrammatically illustrated as aerosol particles 88, only some of which are labeled). The aerosol-forming nozzle may be comprised by any suitable aerosol generator, and may, for example, correspond to an electrostatic nozzle, a piezoelectric nozzle, an ultrasonic or megasonic nozzle, or an electrohydrodynamic atomization nozzle.

Although nozzle 84 is shown within chamber 74, in other embodiments the nozzle may be external of the chamber so that aerosol is formed outside of the chamber, and then passed through an opening in the chamber sidewall to enter the chamber. In any event, nozzle 84 will be proximate the chamber so that aerosol formed by the nozzle may be directed toward the upper surface of the substrate 82 retained within the chamber.

The aerosol particles 88 are directed toward an upper surface of substrate 82. Such may be accomplished by fluid-force propulsion through nozzle 84. The propulsion of the aerosol particles toward the substrate surface may alternatively, or additionally, include blending a gas jet with the fluid stream entering nozzle 84, and utilizing the gas stream to push the aerosol particles toward the substrate. In some embodiments, the propulsion of the aerosol particles toward the substrate surface may alternatively, or additionally, include providing electrical charge to the aerosol particles and to one or more components within the chamber so that the aerosol particles may be electrostatically attracted and/or repelled from various components to direct the aerosol particles toward the substrate. For instance, focusing rings and/or electrodes (not shown) may be utilized to direct the aerosol particles.

In the shown embodiment, nozzle 84 is coupled with a power source 90. The nozzle 84 may be an electrohydrodynamic nozzle powered by source 90. Further, the power source 90 may be utilized to induce a polarity to the aerosol particles 88. In some embodiments, a polarity may be induced on substrate 82 which is opposite to that induced on aerosol particles 88 (for instance, the polarity on the aerosol particles may be negative and that induced on the upper surface of substrate may be positive). The opposite polarities may cause the aerosol particles 88 to be attracted to the upper surface of the substrate by electrostatic forces.

The aerosol particles 88 are shown covering only a small region of the upper surface of substrate 82. In some embodiments, it may be desired to provide the nanoparticles on only specific small regions of the upper surface of the substrate. In other embodiments, it may be desired to provide the nanoparticles across an entirety of the upper surface of the substrate. If it is desired to provide the nanoparticles across the entirety of the upper surface of the substrate, multiple nozzles may be used to create aerosol coverage across the entire surface. Alternatively, or additionally, one or both of the substrate and the aerosol-generating nozzle may be moved during treatment of the substrate. For instance, substrate holder 80 is shown connected to a motor 92 which in turn is connected with a power source 94. The motor may be configured to rotate the substrate holder (as illustrated by arrow 93) when powered by the source 94. The rotation of the substrate holder rotates substrate 82. Rotation of substrate 82 may enable more uniform dispersal of the nanoparticles across an upper source of the substrate than would be achieved without rotation. Also, nozzle 84 is shown coupled to a motor 96, which in turn is coupled to a power source/control unit 98. The motor 96 may be utilized for moving the nozzle 84 laterally within the chamber (as illustrated by arrows 95 and 97) which, in combination with rotation of substrate 82, may enable the nozzle to be utilized for dispersal of nanoparticles across the entire surface of substrate 82.

Although all of the aerosol is shown directed toward the substrate, in practice the aerosol may disperse within the chamber so that some of the aerosol particles do not reach the substrate surface. In some embodiments, the aerosol-generating apparatus is utilized to size sort the nanoparticles. Specifically, the aerosol droplets containing nanoparticles of appropriate size are directed toward the substrate, while aerosol droplets containing nanoparticles outside of a desired size range are not directed along trajectories that reach a surface of the substrate.

An example process for utilizing nanoparticle distribution of the type described in FIG. 10 for fabrication of flash memory cells is described with reference to FIGS. 11-14. Identical numbering will be used in describing FIGS. 11-14 as is used above in describing FIG. 1.

Figure 11:
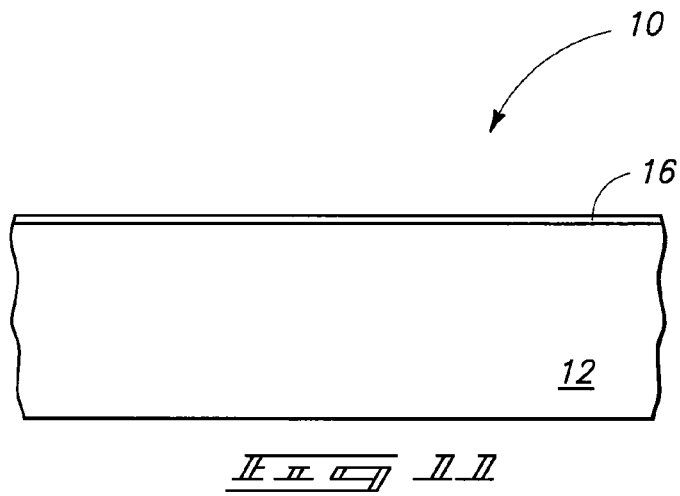
FIGS. 11-14 illustrate process stages of an example embodiment method for fabricating a flash memory cell.

Referring to FIG. 11, construction 10 is shown at an initial processing stage. The construction comprises substrate 12 and the tunnel dielectric 16 formed over substrate 12.

Figure 12:
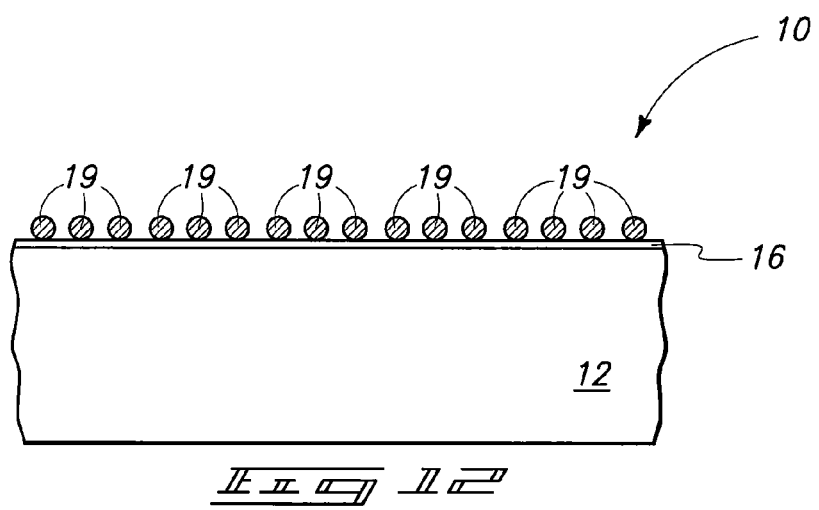

Referring to FIG. 12, nanoparticles 19 are uniformly distributed across an upper surface of tunnel dielectric 16. Such uniform distribution is accomplished utilizing an aerosol generator, such as the example aerosol generator of FIG. 10. The carrier liquid discussed with reference to FIG. 10 has been volatilized to leave only nanoparticles 19 across the upper surface of tunnel dielectric 16. In the shown embodiment, the nanoparticles are not coated. In other embodiments, the nanoparticles at the processing stage of FIG. 12 may correspond to the coated nanoparticles of FIG. 7 or FIG. 8.

The nanoparticles 19 shown in FIG. 12 are of uniform size relative to one another as may be accomplished utilizing the sorting apparatus of FIG. 9 and/or utilizing size sorting with the aerosol generator as discussed with reference to FIG. 10. The individual nanoparticles 19 are spaced from one another by intervening gaps.

Figure 13:
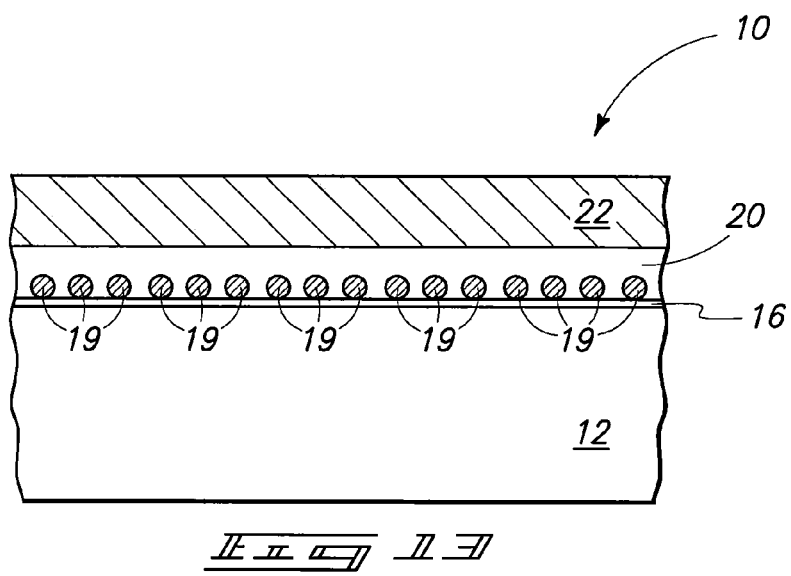

Referring to FIG. 13, blocking dielectric material 20 is deposited over nanoparticles 19, and within the gaps between the nanoparticles. Also, control gate material 22 is deposited over the blocking dielectric material 20.

Figure 14:
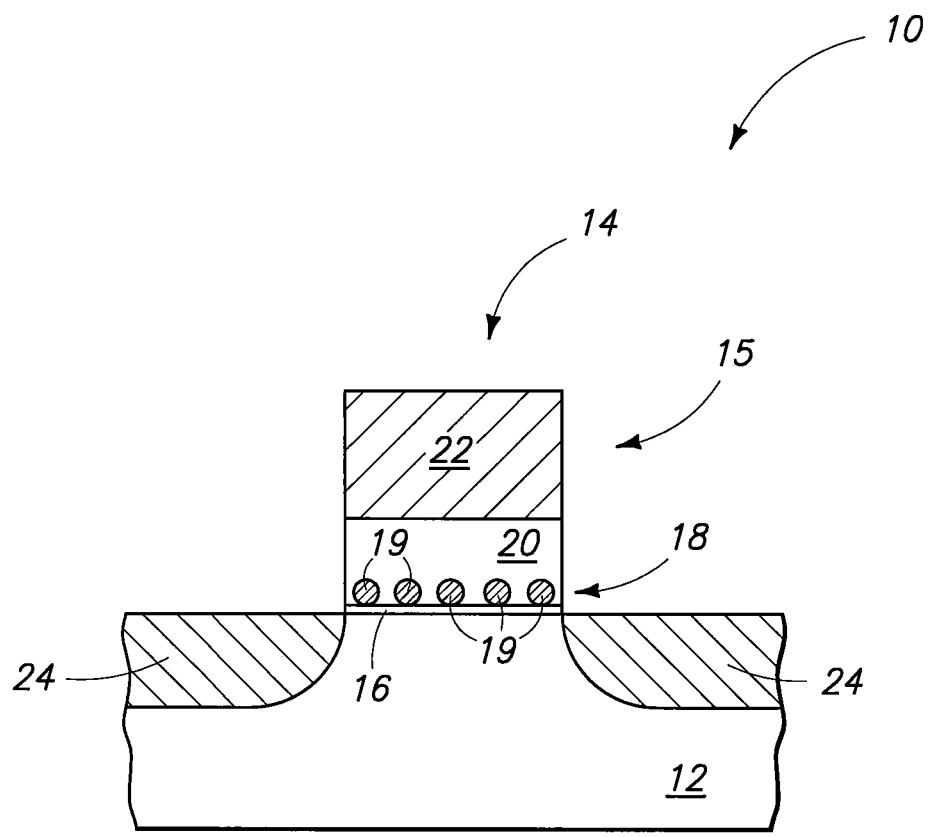

Referring to FIG. 14, the materials 16, 20 and 22 are patterned to form the gate stack 14, and source/drain regions 24 are formed adjacent the gate stack by implanting appropriate dopant into substrate 12.

The nanoparticles 19 form charge-trapping centers within gate stack 14. The amount of charge stored by such charge-trapping centers, and the ease with which the charge may be transferred to and from the charge-trapping centers, may be influenced by the type of materials utilized for nanoparticles 19, the size of the nanoparticles, and the population density of the nanoparticles.

Flash memory cells formed in accordance with the embodiments discussed above may be incorporated into electronic systems, such as, for example, computer systems, cars, phones, cameras, planes, etc.

Figure 15:
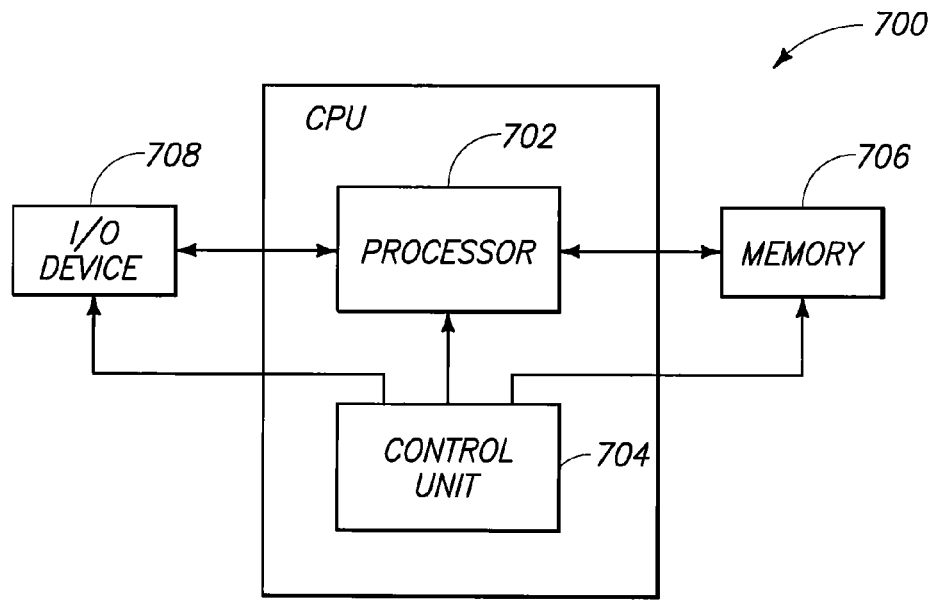
FIG. 15 is a diagrammatic view of a computer embodiment.
Figure 16:
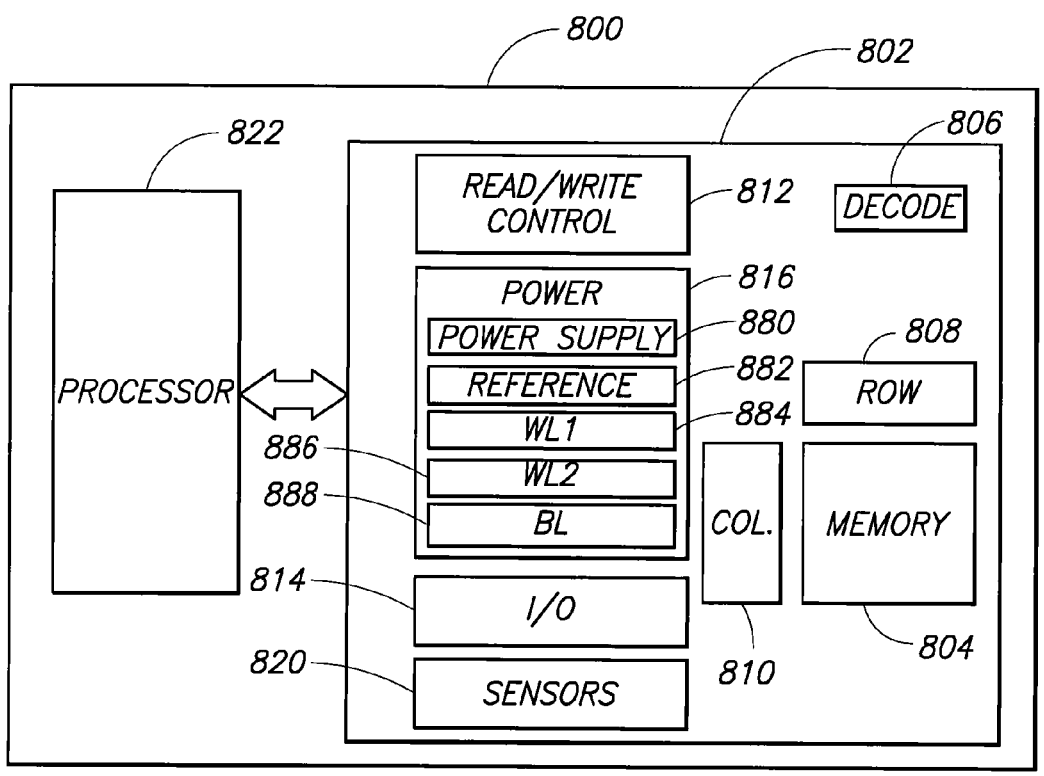
FIG. 16 is a block diagram showing particular features of the motherboard of the FIG. 15 computer embodiment.

FIG. 15 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 16. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

FIG. 17 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

FIG. 18 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a charge-trapping zone, comprising:
    forming a plurality of metallic nanoparticles;
    coating the metallic nanoparticles with dielectric material, the dielectric material consisting of silicon nitride and forms charged surfaces around the coated nanoparticles;
    transferring the coated nanoparticles to a liquid, and forming a dispersion of the coated nanoparticles within the liquid;
    forming an aerosol from the dispersion; and
    directing the aerosol onto a substrate to form charge-trapping centers comprising the coated nanoparticles, individual charge-trapping centers being spaced from one another by intervening gaps.

2. The method of claim 1 wherein the nanoparticles consist of elemental metal.

3. The method of claim 1 wherein the coating utilizes one or more of physical vapor deposition, chemical vapor deposition and atomic layer deposition.

4. The method of claim 1 wherein the coating utilizes a dip of the nanoparticles within a fluid to form coating precursor around the nanoparticles, followed by a cure of the coating precursor to form the coated nanoparticles.

5. A method of forming a charge-trapping zone, comprising:
    forming a plurality of nanoparticles over a surface;
    stripping the nanoparticles from the surface;
    cleaning the nanoparticles;
    coating the cleaned nanoparticles with dielectric material, the dielectric material comprising silicon nitride and has amino groups providing a positive charge along an outer surface of the cleaned nanoparticles;
    transferring the cleaned and coated nanoparticles to a liquid, and forming a dispersion of the coated nanoparticles within the liquid;
    forming an aerosol from the dispersion; and
    directing the aerosol onto a substrate to form charge-trapping centers comprising the coated nanoparticles, individual charge-trapping centers being spaced from one another by intervening gaps.

6. The method of claim 5 further comprising sorting the coated nanoparticles by size prior to forming the aerosol.

7. The method of claim 5 further comprising sorting the coated nanoparticles by size during the directing of the aerosol onto the substrate.

8. The method of claim 5 wherein the forming the aerosol comprises utilization of an electrostatic nozzle, a piezoelectric nozzle, an ultrasonic nozzle, or an electrohydrodynamic atomization nozzle.

9. The method of claim 5 wherein the nanoparticles are metallic.

10. The method of claim 5 wherein the dielectric material forms charged surfaces around the coated nanoparticles.

11. A method of forming a charge-trapping zone, comprising:
- forming a plurality of metallic nanoparticles comprising one or more metals selected from the group consisting of Au, Ag, Co, Ir, Ni, Pd, Pt, Re, Ru, Ta, Te, Ti and W;
- coating the metallic nanoparticles with shell material the shell material containing carboxyl groups providing a negative charge along an outer surface of the nanoparticles;
- transferring the coated nanoparticles to a liquid, and forming a dispersion of the coated nanoparticles within the liquid;
- forming an aerosol from the dispersion; and
- directing the aerosol onto a substrate to form charge-trapping centers comprising the coated nanoparticles, individual nanoparticles being spaced from one another by intervening gaps.

12. The method of claim 11 wherein the shell material comprises silicon oxide.

13. The method of claim 11 wherein the shell material is conductive.

* * * * *